United States Patent
Bouche et al.

(10) Patent No.: US 9,825,031 B1
(45) Date of Patent: Nov. 21, 2017

(54) METHODS OF FORMING A HIGH-K CONTACT LINER TO IMPROVE EFFECTIVE VIA SEPARATION DISTANCE AND THE RESULTING DEVICES

(71) Applicant: GLOBALFOUNDRIES Inc., Grand Cayman (KY)

(72) Inventors: Guillaume Bouche, Albany, NY (US); Andy C. Wei, Queensbury, NY (US); Jason E. Stephens, Menands, NY (US); David M. Permana, Ballston Spa, NY (US); Jagannathan Vasudevan, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/229,292

(22) Filed: Aug. 5, 2016

(51) Int. Cl.
H01L 21/8234 (2006.01)
H01L 27/088 (2006.01)
H01L 21/768 (2006.01)

(52) U.S. Cl.
CPC .... *H01L 27/0886* (2013.01); *H01L 21/76843* (2013.01); *H01L 21/823431* (2013.01); *H01L 21/823468* (2013.01); *H01L 21/823475* (2013.01)

(58) Field of Classification Search
CPC ....... H01L 21/76843; H01L 21/823431; H01L 21/823468; H01L 21/823475; H01L 21/823821; H01L 21/845; H01L 27/0886
See application file for complete search history.

(56) References Cited

U.S. PATENT DOCUMENTS

| 9,337,094 B1* | 5/2016 | Pranatharthiharan | H01L 21/76897 |
| 2005/0064629 A1* | 3/2005 | Yu | H01L 21/76834 438/118 |
| 2005/0287739 A1* | 12/2005 | Mouli | H01L 21/765 438/257 |
| 2007/0218629 A1* | 9/2007 | Kronke | H01L 27/10858 438/257 |
| 2012/0049190 A1* | 3/2012 | Miyairi | H01L 29/04 257/57 |
| 2012/0119307 A1* | 5/2012 | Li | H01L 21/76832 257/410 |
| 2012/0205805 A1* | 8/2012 | Hyun | H01L 21/76831 257/751 |
| 2014/0203348 A1* | 7/2014 | Suk | H01L 29/66545 257/327 |

(Continued)

*Primary Examiner* — Bitew Dinke
(74) *Attorney, Agent, or Firm* — Amerson Law Firm, PLLC

(57) ABSTRACT

A method includes forming first and second contact openings in a first dielectric layer. At least the first contact opening is at least partially lined with a liner layer. A first conductive feature is formed in the first contact opening and a second conductive feature is formed in the second contact opening. A portion of the liner layer adjacent a top surface of the first dielectric layer is removed to define a recess. A barrier layer is formed above the first dielectric layer and in the recess. The barrier layer has a first dielectric constant greater than a second dielectric constant of the first dielectric layer. A second dielectric layer is formed above the barrier layer. A third conductive feature is formed embedded in the second dielectric layer and contacting the second conductive feature.

16 Claims, 8 Drawing Sheets

(56) References Cited

U.S. PATENT DOCUMENTS

| | | | |
|---|---|---|---|
| 2014/0284734 A1* | 9/2014 | Kanaya | H01L 43/02 257/421 |
| 2014/0349476 A1* | 11/2014 | Chen | H01L 21/76816 438/620 |
| 2015/0084132 A1* | 3/2015 | Chou | H01L 29/518 257/369 |
| 2016/0268158 A1* | 9/2016 | Leobandung | H01L 21/7682 |
| 2016/0379925 A1* | 12/2016 | Ok | H01L 29/78 257/288 |
| 2017/0054004 A1* | 2/2017 | Cheng | H01L 29/66795 |

\* cited by examiner

METHODS OF FORMING A HIGH-K CONTACT LINER TO IMPROVE EFFECTIVE VIA SEPARATION DISTANCE AND THE RESULTING DEVICES

BACKGROUND OF THE INVENTION

1. Field of the Invention

The present disclosure generally relates to the fabrication of integrated circuits, and, more particularly, to various methods of forming a high-k contact liner to improve effective via separation distance and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1A is a perspective view of an illustrative prior art FinFET semiconductor device 10 that is formed above a semiconductor substrate 15 at an intermediate point during fabrication. In this example, the FinFET device 10 includes three illustrative fins 20, an isolation region 25 formed in trenches between the fins 20, a gate structure 30 formed above the fins 20, sidewall spacers 35 formed on sidewalls of the gate structure 30, and a gate cap layer 40 formed on a top surface of the gate structure 30. The fins 20 have a three-dimensional configuration: a height, a width and an axial length. The portions of the fins 20 covered by the gate structure 30 are the channel regions of the FinFET device 10, while the portions of the fins 20 positioned laterally outside of the spacers 35 are part of the source/drain regions of the FinFET device 10. Although not depicted, the portions of the fins 20 in the source/drain regions may have additional epi semiconductor material formed thereon in either a merged or unmerged condition.

FIG. 1B is a cross-sectional view of an illustrative integrated circuit product 100 including a transistor device 105 formed in and above a semiconductor substrate 110. In the depicted example, the transistor device 105 includes an illustrative gate structure, i.e., a gate insulation layer 115 and a gate electrode 120, a gate cap layer 125, a sidewall spacer 130 and simplistically depicted source/drain regions 135. Although a planar device is illustrated, the discussion is also applicable to a FinFET device, such as the device 10 of FIG. 1A. At the point of fabrication depicted in FIG. 1B, layers of insulating material 135, 140, i.e., interlayer dielectric materials, have been formed above the product 100. Other layers of material, such as contact etch stop layers and the like, are not depicted in the attached drawings. A source/drain contact structure 140 connects to the source/drain region 135, referred to as a "CA" contact, and a gate contact structure 145 connects to the gate electrode 120, referred to as a "CB" contact. Also depicted in FIG. 1B is the first metallization layer—the so-called M1 layer—of the multi-level metallization system for the product 100 that is formed in the layer of insulating material 140, e.g., a low-k insulating material. A plurality of conductive vias—so-called V0 vias 150—are provided to establish electrical connection between the device-level contacts—the CA contact 140 and the CB contact 145—and the M1 layer. The M1 layer typically includes a plurality of metal lines 155 that are routed as needed across the product 100.

To prevent dielectric breakdown and a resulting short between the CA contact 140 and the CB contact 145, a sufficient thickness of dielectric material, referred to as the minimum dielectric distance, is provided therebetween. This dielectric separation distance is represented by the arrow 160. However, due to misalignment inherent when forming the via 150, the distance between the via 150 and the CB contact 145 may be less than the distance 160, as shown by the separation distance 165. To address the alignment variations, the product 100 is designed so that the distance 165 is greater than the minimum dielectric distance under worst case misalignment conditions. As a result, the distance between the CA contact 140 and the CB contact 145 in the design of the product 100 is increased, resulting in a decreased pattern density.

The present disclosure is directed to various methods and resulting devices that may avoid, or at least reduce, the effects of one or more of the problems identified above.

SUMMARY OF THE INVENTION

The following presents a simplified summary of the subject matter in order to provide a basic understanding of some aspects thereof. This summary is not an exhaustive overview of the subject matter. It is not intended to identify key or critical elements of the subject matter or to delineate the scope of the subject matter. Its sole purpose is to present some concepts in a simplified form as a prelude to the more detailed description that is discussed later.

Generally, the present disclosure is directed to various methods of forming a high-k contact liner to improve effective via separation distance and the resulting devices. One illustrative method includes, among other things, forming first and second contact openings in a first dielectric layer. At least the first contact opening is at least partially lined with a liner layer. A first conductive feature is formed in the first contact opening and a second conductive feature is formed in the second contact opening. A portion of the liner layer adjacent a top surface of the first dielectric layer is removed to define a recess. A barrier layer is formed above the first dielectric layer and in the recess. The barrier layer has a first dielectric constant greater than a second dielectric constant of the first dielectric layer. A second dielectric layer is formed above the barrier layer. A third conductive feature is formed embedded in the second dielectric layer and contacting the second conductive feature.

Another illustrative method includes, among other things, forming first, second and third gate structures above a fin. A sacrificial contact is formed between the first and second gate structures. A liner layer is formed above the sacrificial contact. A first dielectric layer is formed above the liner layer and the sacrificial contact. The sacrificial contact is removed to define a first contact opening in the first dielectric layer exposing a first source and drain region of the fin.

The contact opening is at least partially lined by the liner layer. A second contact opening is formed in the first dielectric layer to expose a portion of the third gate structure. A conductive material is formed in the first and second contact openings to define a first conductive feature in the first contact opening and a second conductive feature in the second contact opening. A portion of the liner layer disposed adjacent a top surface of the first dielectric layer is removed to define a recess. A barrier layer is formed above the first dielectric layer and in the recess. The barrier layer has a first dielectric constant greater than a second dielectric constant of the first dielectric layer. A second dielectric layer is formed above the barrier layer. A third conductive feature is formed embedded in the second dielectric layer and contacting the second conductive feature.

One illustrative device includes, among other things, a first conductive feature embedded in a first dielectric layer. A dielectric liner layer is disposed between a first sidewall portion of the first conductive feature and the first dielectric layer. A second conductive feature is embedded in the first dielectric layer adjacent the first conductive feature. A barrier layer is disposed on a top surface of the first dielectric layer and in a first recess defined adjacent a second sidewall portion of the first conductive feature. The first recess is positioned adjacent the top surface of the first dielectric layer, and the barrier layer has a first dielectric constant greater than a second dielectric constant of the first dielectric layer. A second dielectric layer is disposed above the barrier layer. A third conductive feature is embedded in the second dielectric layer and contacts the second conductive feature.

BRIEF DESCRIPTION OF THE DRAWINGS

The disclosure may be understood by reference to the following description taken in conjunction with the accompanying drawings, in which like reference numerals identify like elements, and in which.

Figure 1A:
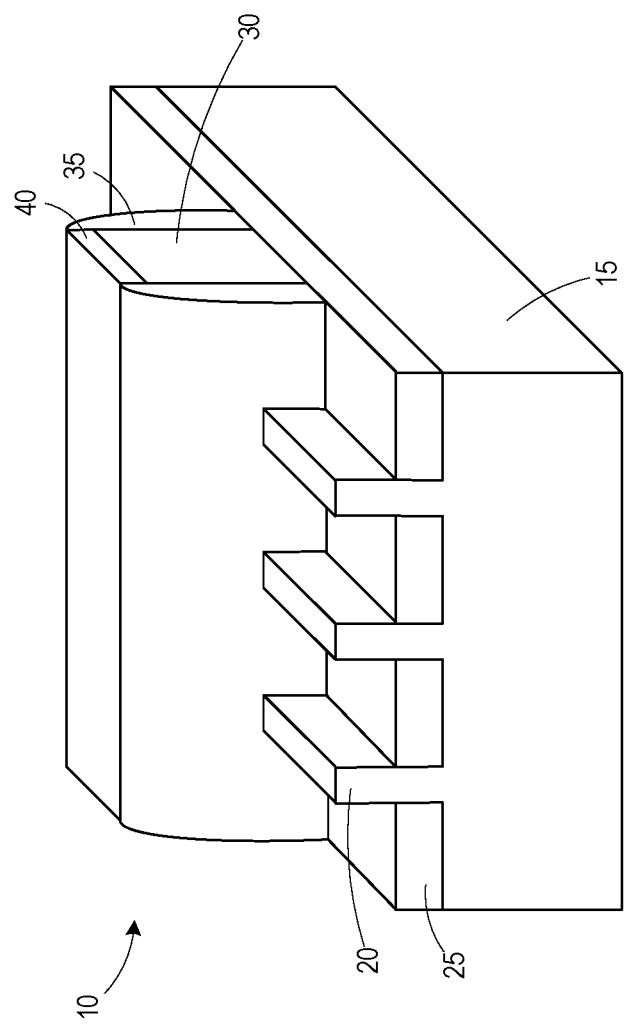
FIGS. 1A-1B are views of an illustrative embodiment of a prior art semiconductor product.
Figure 1B:
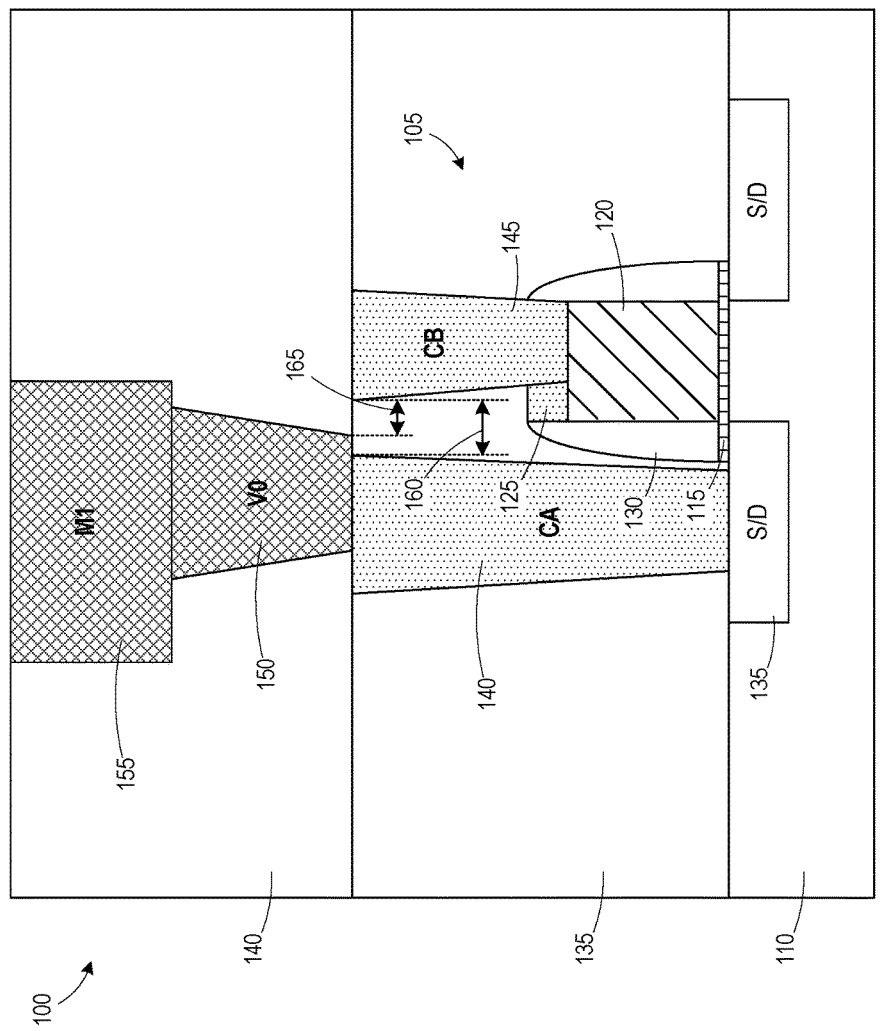

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a high-k contact liner to improve effective via separation distance and the resulting devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The embodiments disclosed herein should not be considered to be limited to the illustrative examples depicted and described herein. With reference to the attached figures, various illustrative embodiments of the methods and devices disclosed herein will now be described in more detail.

FIGS. 2A-2L depict one illustrative method disclosed for forming a high-k contact liner to improve effective via separation distance and the resulting devices. The illustrative product 200 includes a substrate 205 in which a plurality of trenches was formed to define a plurality of fins 210. FIGS. 2A-2L illustrate the product 200 in a cross-sectional view taken along a long axis of one of the fins 210. The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers.

Figure 2A:
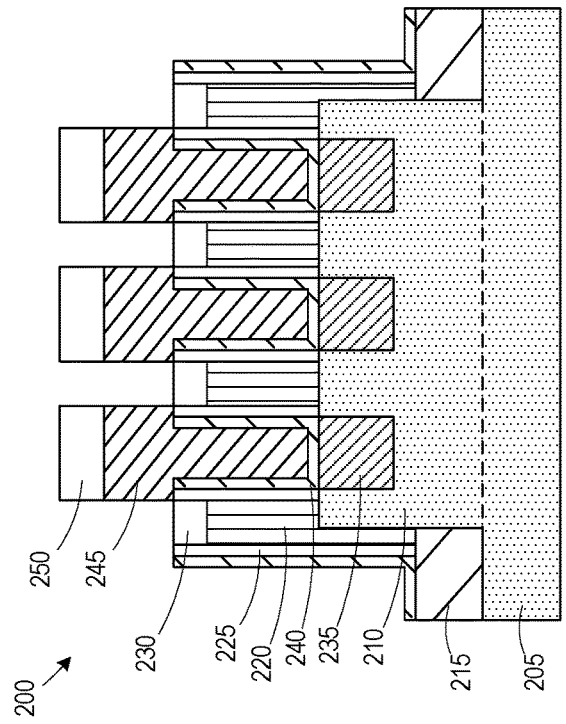
FIGS. 2A-2L depict one illustrative method disclosed for forming a high-k contact liner to improve effective via separation distance and the resulting devices.

FIG. 2A depicts the product 200 at a point in fabrication wherein several process operations have been performed. The plurality of fins 210 was formed, such as by etching trenches in the substrate 205. In general, the fins 210 define an active region for forming devices, such as FinFET transistors. An isolation structure 215 (e.g., silicon dioxide) is formed in the trenches between and adjacent the fins 210. A plurality of gate structures 220 are formed above the fins 210. Spacers 225 (e.g., silicon nitride) are formed on sidewalls of the gate structures 220 and a cap layer 230 is formed on top surfaces of the gate structures 220. Source and drain regions 235 are defined in portions of the fin 210. For example, the fin 210 may be recessed using the gate structures 220 as an etch mask to define cavities and the cavities may be filled with an alternative material, such as silicon germanium, to define the source and drain regions 235. The gate structures 220 may include a gate insulation layer (not separately shown) and one or more conductive layers to define a gate electrode (not separately shown). A contact etch stop layer 240 was formed on surfaces of the isolation structures 215, the spacers 225, and the source and drain regions 235. In the illustrated embodiment, the gate structures 220 were formed using a replacement technique, where a sacrificial material was first formed and then later replaced with the gate insulation layer and conductive material of the gate electrode.

Figure 2B:
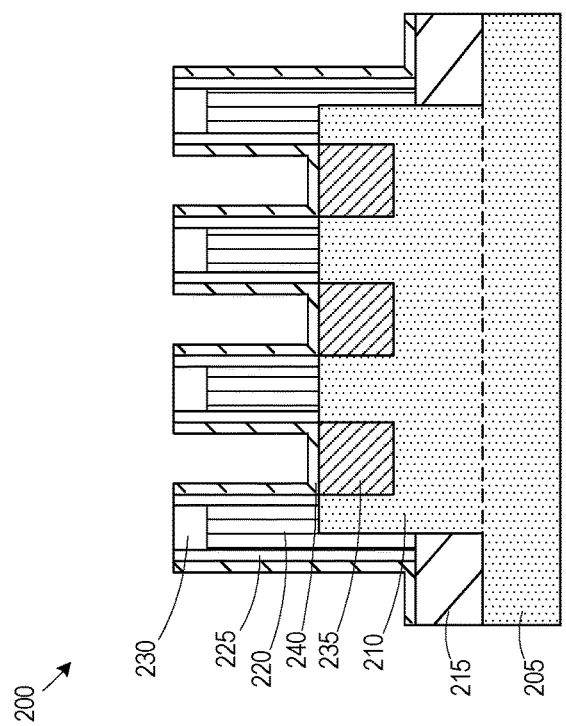

FIG. 2B illustrates the product 200 after a plurality of processes was performed to form sacrificial contacts 245 above selected portions of the source and drain regions 235. A deposition process was performed to deposit a sacrificial material (e.g., amorphous silicon). A hard mask layer (e.g., silicon nitride) was formed over the sacrificial material and patterned to define a patterned hard mask layer 250. The sacrificial material was etched using the patterned hard mask 250 to define the sacrificial contacts 245.

Figure 2C:
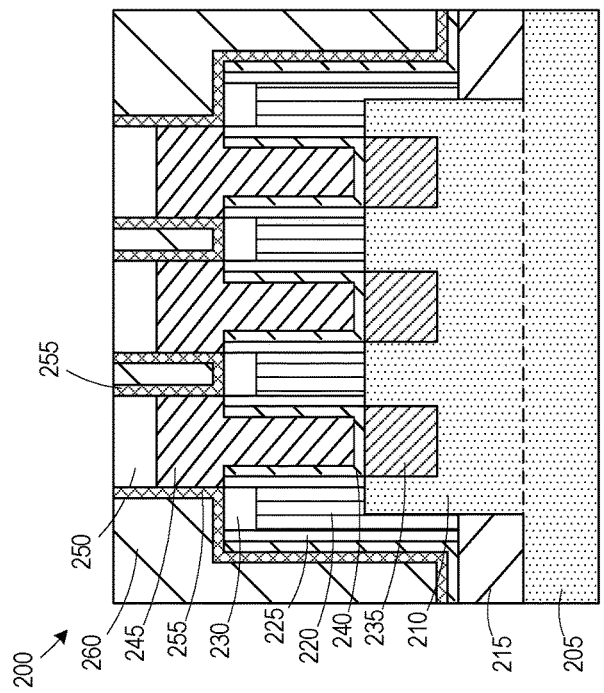

FIG. 2C illustrates the product 200 after a deposition process (e.g., ALD) was performed to form a liner layer 255 (e.g., silicon dioxide) above the sacrificial contacts 245.

Figure 2D:
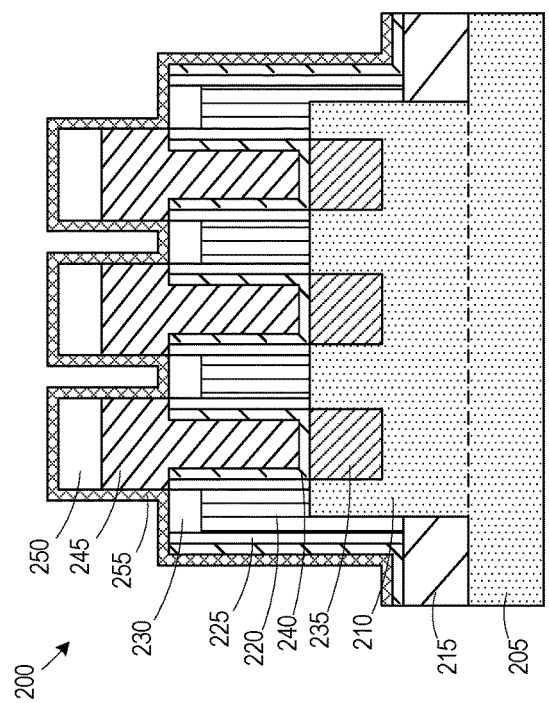

FIG. 2D illustrates the product 200 after a plurality of processes was performed to form a dielectric layer 260 (e.g., SiOC) above the liner layer 255. In one embodiment, the dielectric layer 260 is a low-k material or an ultra-low-k material (i.e., having a dielectric constant small compared to silicon dioxide, e.g., <3.9). A deposition process was performed to deposit the material of the dielectric layer 260 and a planarization process was performed to planarize the dielectric layer 260 using the patterned hard mask layer 250 as a stop layer.

Figure 2F:
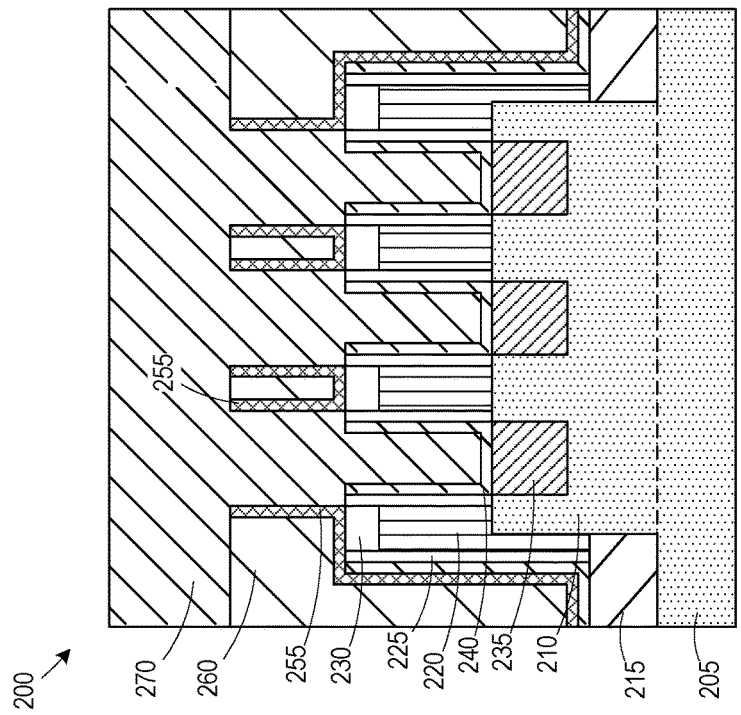
Figure 2E:
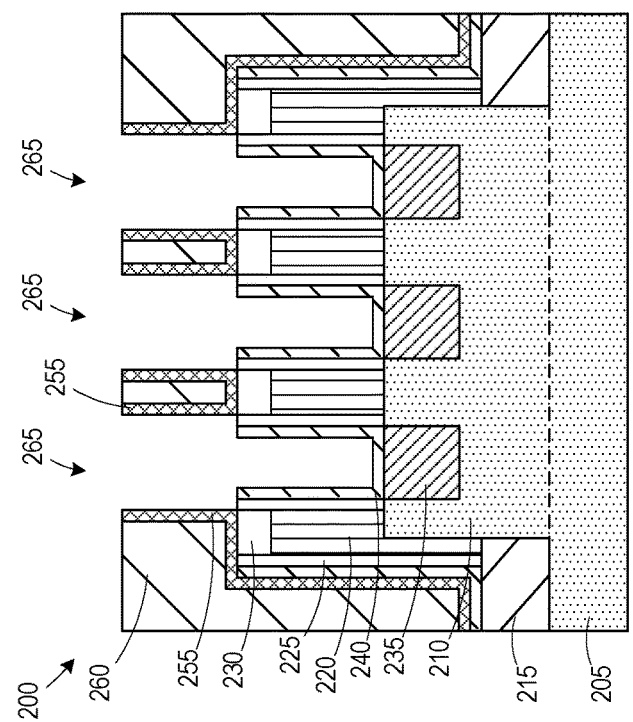

FIG. 2E illustrates the product 200 after one or more etch processes were performed to remove the patterned hard mask layer 250 and the sacrificial contacts 245 to define openings 265.

FIG. 2F illustrates the product 200 after a deposition process was performed to deposit a patterning layer 270 (e.g., deep ultraviolet light absorbing oxide (DUO™)) above the dielectric layer 260 and filling the openings 265.

Figure 2G:
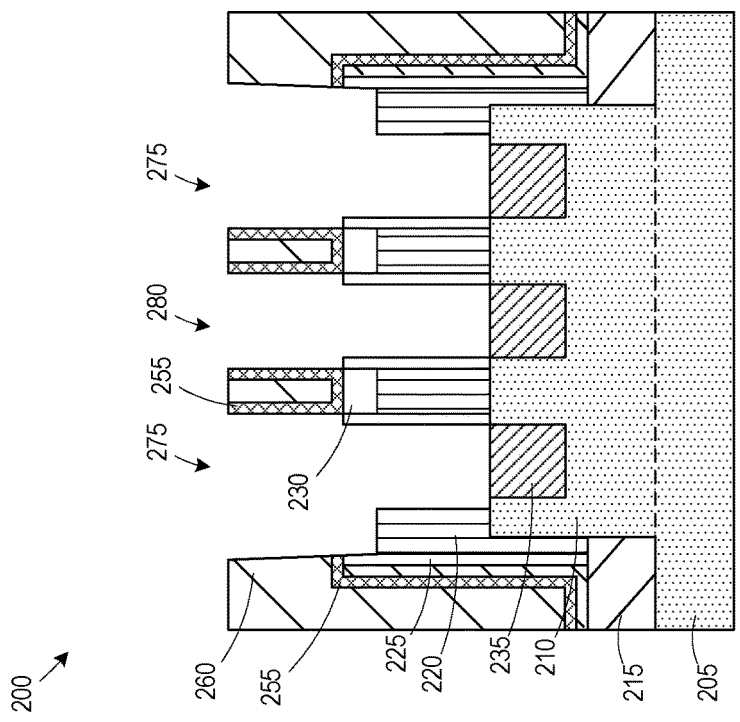

FIG. 2G illustrates the product 200 after a plurality of processes was performed to define gate contact openings 275 (CB contact openings) in the dielectric layer 260. One or more mask layers (not shown) were formed above the patterning layer 270 and patterned to define openings. An etch process (e.g., anisotropic) was performed to etch the patterning layer 270 and the dielectric layer 260 to define the gate contact openings 275. The size and depth of the gate contact openings 275 are illustrative and may vary depending on the particular implementation. Portions of the cap layer 230, the spacers 225 and the contact etch stop layer 255 exposed during the etch process may also be partially removed.

Figure 2H:
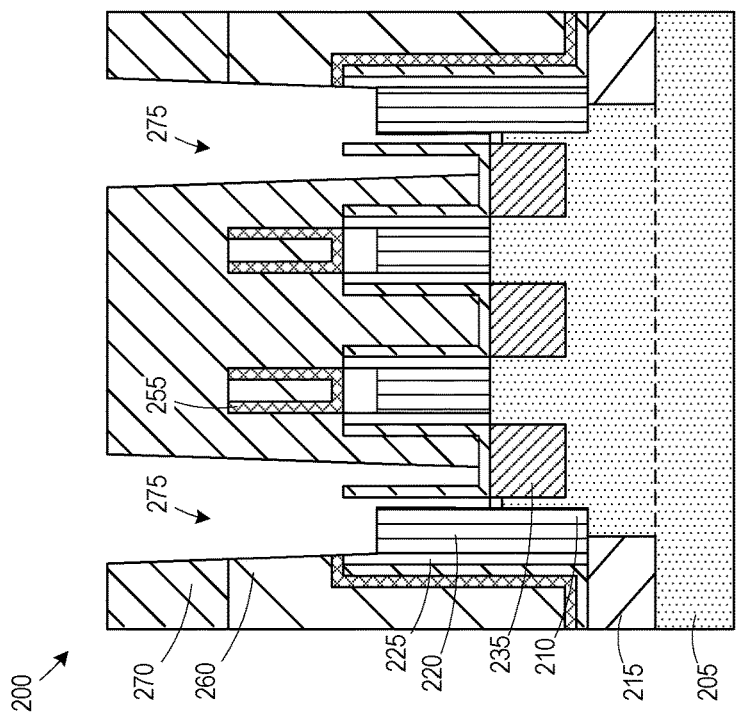

FIG. 2H illustrates the product 200 after a plurality of etch processes was performed to strip the patterning layer 270 and remove the exposed portions of the contact etch stop layer 255, thereby forming source and drain contact openings 280 (e.g., CB contact openings). The gate contact openings 275 expose both the gate structures 220 and the adjacent source and drain regions 235.

Figure 2J:
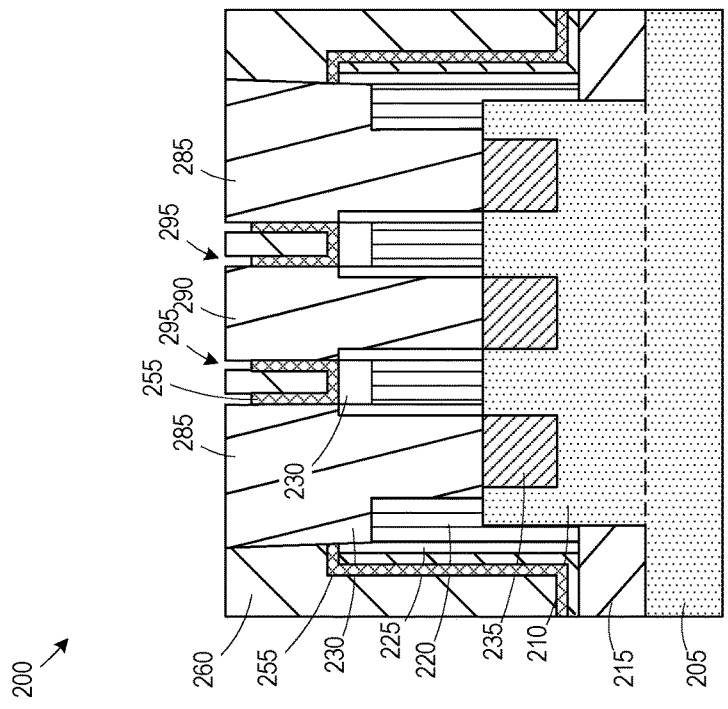
Figure 2I:
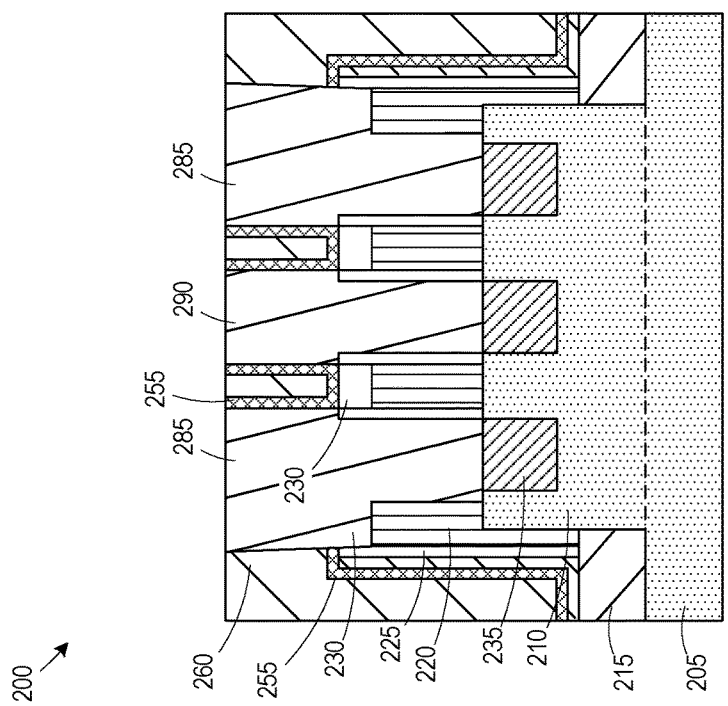

FIG. 2I illustrates the product 200 after a plurality of processes was performed to form gate contacts 285 in the gate contact openings 275 and source and drain contacts 290 in the source and drain contact openings 280. One or more deposition processes were performed so as to over-fill the contact openings 275, 280 with a conductive material. Then, a planarization process was performed to remove excess conductive material. The contacts 285, 290 may include multiple layers, such as one or more barrier layers (e.g., Ta, TaN, TiN, etc.) to prevent migration of any metal into the dielectric layer 260 and a metal fill material (e.g., tungsten, metal silicide, copper). In the illustrated embodiments, the gate contacts 285 cross-couple the gate structures 225 and the source and drain regions 235, however, the application of the present subject matter is not limited to cross-coupled arrangements. Thus, the gate contacts 285 may only contact the gate structures 220.

FIG. 2J illustrates the product 200 after a wet etch process was performed to recess the liner layer 255 to define recesses 295 adjacent the gate contact 285 and the source and drain contact 290. In one embodiment, the use of SiOC material for the dielectric layer 260 provides etch selectivity for the selective recessing of the silicon dioxide material of the liner layer 255. Of course, other materials that provide etch selectivity may also be used.

Figure 2L:
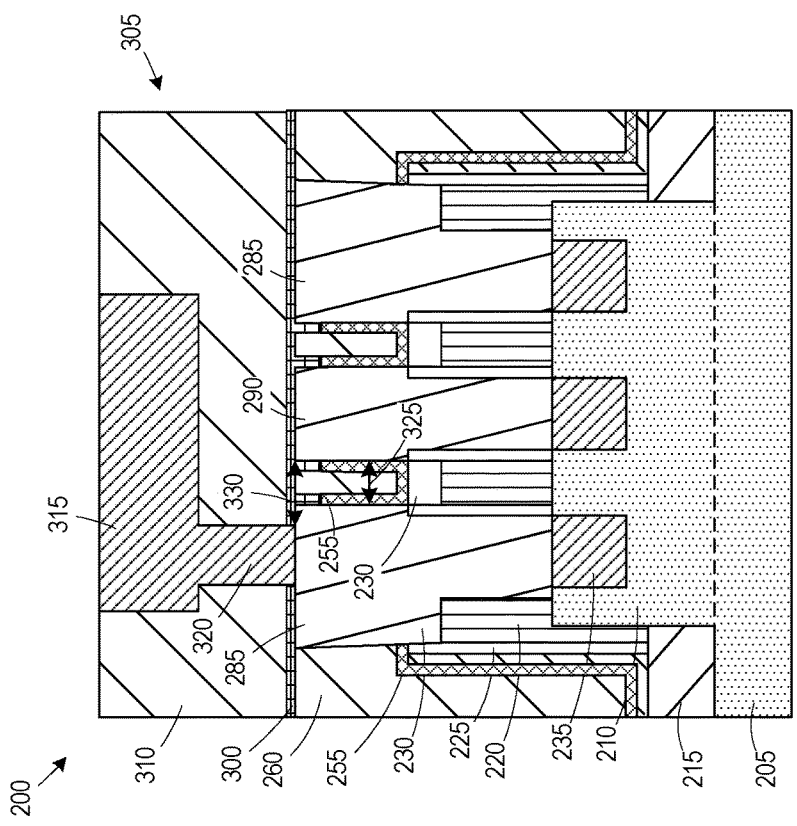
Figure 2K:
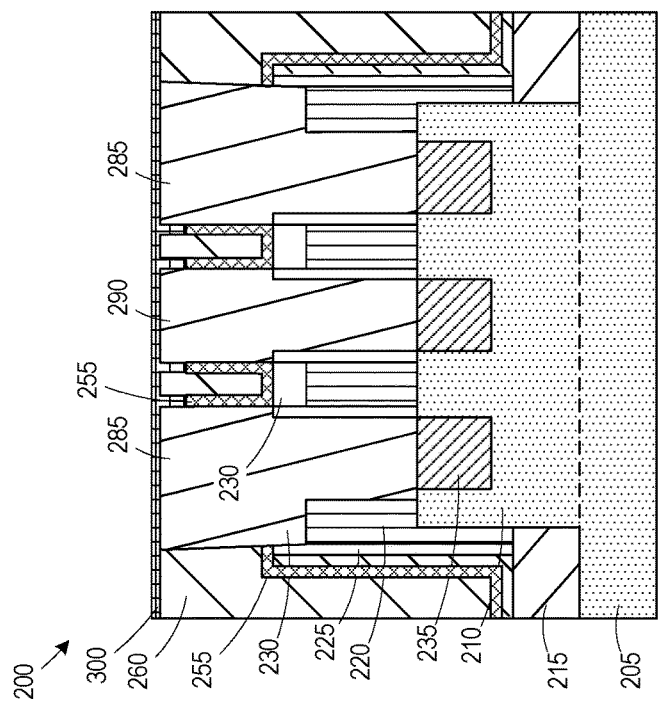

FIG. 2K illustrates the product 200 after a deposition process was performed to deposit a high-k barrier layer 300 (e.g., aluminum nitride (AlN)) above the dielectric layer 260 and in the recesses 295. In general, the high-k barrier layer 300 has a dielectric constant greater than that of the liner layer 255 (e.g., >3.9 associated with silicon dioxide, e.g., <3.9).

FIG. 2L illustrates the product 200 after a plurality of processes was performed to define a metallization layer 305 above the dielectric layer 260. A deposition process was performed to deposit a dielectric layer 310 (e.g., a low-k dielectric material (e.g., SiOC) above the high-k barrier layer 300. One or more patterning and etch processes were performed to define interconnect openings in the dielectric layer 310. An etch process was performed to remove a portion of the barrier layer to expose the gate contact 285. One or more deposition processes were performed to deposit a conductive material in the interconnect openings to define a conductive line 315 and a conductive via 320. The conductive line 315 and the conductive via 320 may include multiple layers, such as a barrier layer (e.g., Ta, TaN, TiN, etc.), a seed layer (e.g., copper), and a conductive fill material (e.g., copper). The dielectric separation distance 325 between the gate contact 285 and the source and drain contact 290 is defined by the thickness of the liner layer 255 and the portion of the dielectric layer 260 disposed therebetween. The dielectric separation distance 330 between the via 320 in the overlying metallization layer and the source and drain contact 290 is defined by the portions of the dielectric layers 260, 310 disposed therebetween and also by the portions of the high-k barrier layer 300 formed in the recesses 295. The high-k barrier layer 300 disposed in the recesses 295 increases the effective dielectric distance by interposing a material with a higher dielectric constant relative to that of the dielectric layers 255, 260, 310. Because the high-k barrier layer 300 is formed only in the recesses adjacent the top surfaces of the dielectric layer 260 and the gate contact 285, the increase in the overall capacitance of the product 200 is relatively small.

The use of a high-k material lining an upper portion of a contact opening, as described herein, increases the effective dielectric distance between a first conductive feature embedded in a first dielectric layer and a second conductive feature embedded in an overlying second dielectric layer. The increased effective dielectric distance allows design constraints to be relaxed or packing density to be increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method comprising:
   forming first, second and third gate structures above a fin;
   forming a sacrificial contact between said first and second gate structures;
   forming a liner layer above said sacrificial contact;
   forming a first dielectric layer above said liner layer and said sacrificial contact;
   removing said sacrificial contact to define a first contact opening in said first dielectric layer exposing a first source and drain region of said fin, said contact opening being at least partially lined by said liner layer;
   forming a second contact opening in said first dielectric layer to expose a portion of said third gate structure;
   forming a conductive material in said first and second contact openings to define a first conductive feature in said first contact opening and a second conductive feature in said second contact opening;
   removing a portion of said liner layer disposed adjacent a top surface of said first dielectric layer to define a recess;
   forming a barrier layer above said first dielectric layer and in said recess, said barrier layer having a first dielectric constant greater than a second dielectric constant of said first dielectric layer;
   forming a second dielectric layer above said barrier layer; and
   forming a third conductive feature embedded in said second dielectric layer and contacting said second conductive feature.

2. The method of claim 1, wherein said barrier layer comprises aluminum nitride.

3. The method of claim 2, wherein said first dielectric layer comprises a low-k dielectric layer.

4. The method of claim 1, wherein said liner layer comprises silicon dioxide.

5. The method of claim 1, wherein said second contact opening also exposes a second source and drain region of said fin, and said second conductive feature contacts said second source and drain region and said third gate structure.

6. The method of claim 1, wherein at least a portion of said second contact opening is lined with said liner layer, and a first portion of said recess is defined in said first contact opening and a second portion of said recess is defined in said second contact opening.

7. The method of claim 1, wherein said sacrificial contact has a hard mask layer disposed on a top surface thereof, and the method further comprises:
   planarizing said first dielectric layer to expose said hard mask layer; and
   removing said hard mask layer to expose said sacrificial contact.

8. The method of claim 1, wherein said sacrificial contact comprises a first sacrificial contact, and the method further comprises:
   forming a second sacrificial contact between said second and third gate structures;
   removing said second sacrificial contact to define said second contact opening; and
   performing at least one etch process to expose a portion of said third gate structure.

9. The method of claim 8, further comprising performing at least one etch process to widen said second contact opening.

10. A method, comprising
    forming a plurality of gate structures above a fin,
    forming a sacrificial contact between two adjacent ones of said plurality of gate structures;
    forming a liner layer above said sacrificial contact;
    forming a first dielectric layer above said liner layer and said sacrificial contact;
    forming first and second contact openings in a first dielectric layer, wherein at least said first contact opening is formed by removing said sacrificial contact and is at least partially lined with a liner layer;
    forming a first conductive feature in said first contact opening and a second conductive feature in said second contact opening, wherein said first conductive feature contacts a first source and drain region of said fin disposed between two adjacent ones of said plurality of gate structures and said second conductive feature contacts one of said plurality of gate structures;
    removing a portion of said liner layer adjacent a top surface of said first dielectric layer to define a recess;
    forming a barrier layer above said first dielectric layer and in said recess, said barrier layer having a first dielectric constant greater than a second dielectric constant of said first dielectric layer;
    forming a second dielectric layer above said barrier layer, and
    forming a third conductive feature embedded in said second dielectric layer and contacting said second conductive feature.

11. The method of claim 10, wherein said barrier layer comprises aluminum nitride.

12. The method of claim 11, wherein said first dielectric layer comprises a low-k dielectric layer.

13. The method of claim 10, wherein said liner layer comprises silicon dioxide.

14. The method of claim 10, wherein at least a first portion of said first contract opening and a second portion of said second contact opening are lined with said liner layer, a first portion of said recess is defined in said first contact opening, and a second portion of said recess is defined in said second contact opening.

15. The method of claim 10, wherein said second contact opening also exposes a second source and drain region of said fin, and said second conductive feature contacts said second source and drain region and said one of said plurality of gate structures.

16. The method of claim 10, wherein said sacrificial contact has a hard mask layer disposed on a top surface thereof, and the method further comprises:
- planarizing said first dielectric layer to expose said hard mask layer; and
- removing said hard mask layer to expose said sacrificial contact.

* * * * *